United States Patent [19]

Kawasaki

[11] Patent Number: 5,021,118
[45] Date of Patent: Jun. 4, 1991

[54] METHOD OF DRAWING-UP A SINGLE CRYSTAL USING A DOUBLE-CRUCIBLE APPARATUS AND DOUBLE-CRUCIBLE APPARATUS AND DOUBLE-CRUCIBLE APPARATUS THEREFOR

[75] Inventor: Akihisa Kawasaki, Osaka, Japan

[73] Assignee: Sumitomo Electric Industries, Ltd., Osaka, Japan

[21] Appl. No.: 933,924

[22] Filed: Nov. 24, 1986

[30] Foreign Application Priority Data

Nov. 25, 1985 [JP] Japan .................................. 60-265489

[51] Int. Cl.⁵ ...................... C30B 15/00; C30B 35/00
[52] U.S. Cl. ................................. 156/607; 156/617.1; 156/620.2; 156/605; 422/249
[58] Field of Search ............ 156/608, 617 SP, 617 V, 156/605, DIG. 83, 607, 617.1, 620.2; 422/248, 249, 253; 148/33

[56] References Cited

U.S. PATENT DOCUMENTS

| 2,892,739 | 6/1959 | Rusler ................................ 422/249 |
| 3,015,592 | 1/1962 | Leopold .............................. 422/249 |
| 4,246,064 | 1/1981 | Dewees et al. ..................... 156/608 |
| 4,456,499 | 6/1984 | Lin ....................................... 156/608 |
| 4,584,174 | 4/1986 | Morioka et al. ..................... 148/33 |
| 4,609,425 | 9/1986 | Manteika et al. ............ 156/DIG. 83 |

FOREIGN PATENT DOCUMENTS

| 0162467 | 10/1985 | European Pat. Off. ....... 156/617 SP |
| 1229489 | 9/1960 | France . |
| 1026591 | 2/1986 | Japan ............................. 156/617 SP |

OTHER PUBLICATIONS

Valcic, A., "A Process For Obtaining Single Crystals With Uniform Solute Concentraton", Solid State Electronics, vol. 5, 1960, pp. 131-134.

Weiner et al., "Liquid Encapsulated Czochralski Growth of GaAs", J. Electrochem. Soc., 118 (1971) pp. 301-306.

Nygren, S., "Liquid Encapsulated Growth of 35mm Diameter Single Crystals of GaP", J. Crys. Growth 19 (1973) 21-32.

2300 Journal of Crystal Growth 65(1983) Dec., No. 1/3, Amsterdam, Netherlands, Czochralski Growth By The Double Container Technique; D. Mateika et al.

Primary Examiner—H. M. S. Sneed
Assistant Examiner—R. Bruce Breneman
Attorney, Agent, or Firm—Cushman, Darby & Cushman

[57] ABSTRACT

A method and apparatus for drawing up a single crystal using a double-crucible apparatus and a liquid capsule process. The inner crucible of the double-crucible apparatus is attached to the outer crucible. The presence of through holes in the lower portions of the inner crucible allow communication between the molten raw material in the inner and outer crucibles. Through holes in the upper portion of the inner crucible allow communication between the liquid sealing agent covering the molten raw material in the inner and outer crucibles. Single crystals having uniform impurity concentration and few defects are rapidly grown because the interface between the liquid sealing agent and molten raw material in the inner crucible is even with the same interface in the outer crucible.

4 Claims, 4 Drawing Sheets

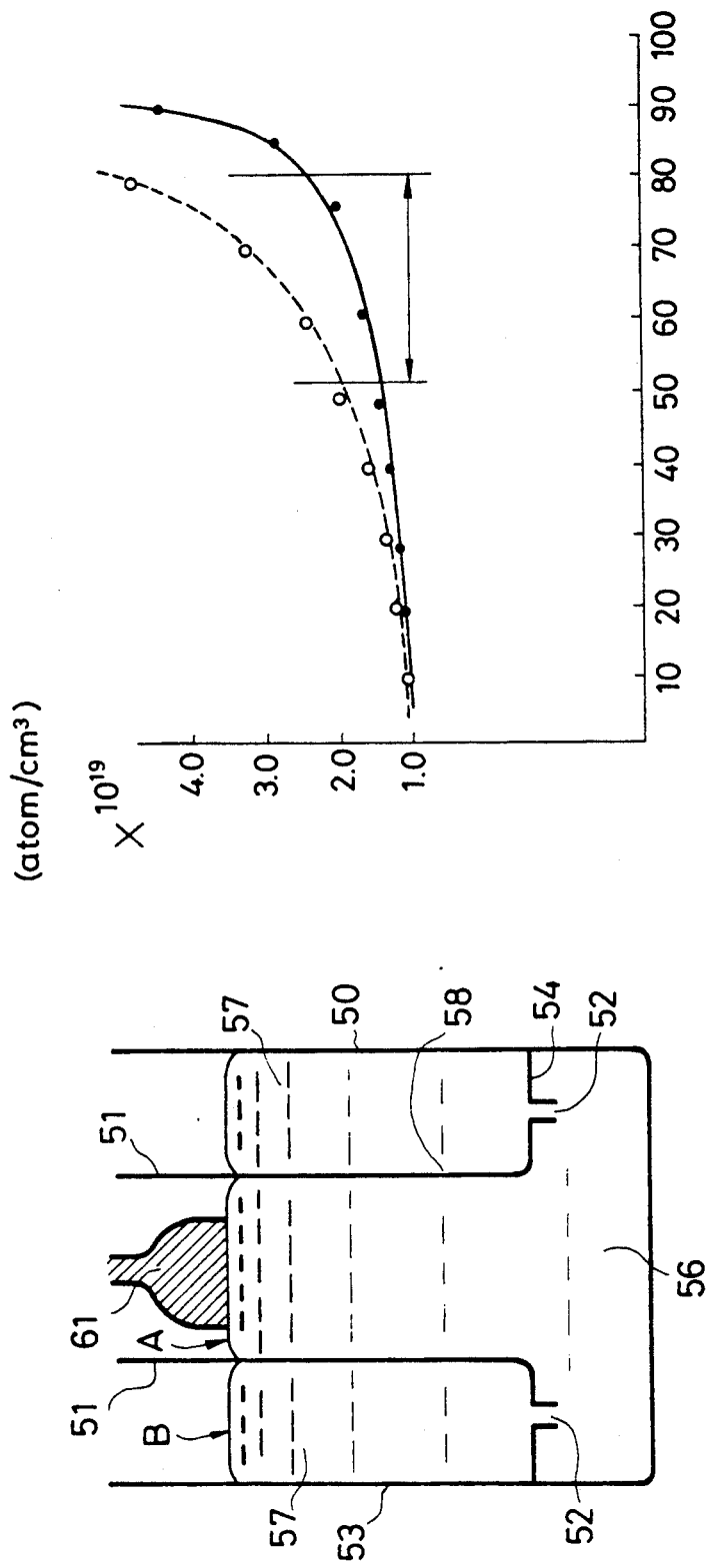

METHOD OF DRAWING-UP A SINGLE CRYSTAL USING A DOUBLE-CRUCIBLE APPARATUS AND DOUBLE-CRUCIBLE APPARATUS AND DOUBLE-CRUCIBLE APPARATUS THEREFOR

BACKGROUND OF THE INVENTION

The present invention relates, in general, to a method of growing Group III-V compound semiconductor single crystals of GaAs, InP, GaP, InAs, etc., and Group II-VI compound semiconductor single crystals of ZnSe, ZnS, CdSe, etc., using a liquid encapsulation drawing-up process (LEC process), and an apparatus therefor. The present invention relates, in particular, to an improved method of drawing-up a single crystal using a specific double-crucible apparatus for the purpose of uniformly doping impurities in the single crystal, and an apparatus therefor.

A method of drawing-up a single crystal using a double-crucible apparatus (hereinafter, referred to as a double-crucible method) is used for uniformly doping impurities in the single crystal. If the coefficient of impurity segregation in a molten raw material is not 1, the concentration of impurity in the single crystal will vary as the single crystal is drawn up when the single crystal is grown using a single-crucible method. In order to prevent this variation, a double-crucible method is used.

A double-crucible apparatus comprises an outer and an inner crucible. There are a variety of inner crucibles having various shapes. Double-crucible methods, such as that described above, may be classified into various categories depending on the shape of the inner crucible. A thin through hole is bored in the inner crucible so that molten raw material in the outer crucible is allowed to flow into the inner crucible through the thin through hole. The molten raw material, however, barely passes through the through hole from the inner crucible into the outer one. Therefore, it is possible to keep molten raw material within the inner crucible (hereinafter, referred to as inner molten raw material) and molten raw material within the outer crucible (hereinafter, referred to as outer molten raw material). Inner and outer molten raw material differ in impurity concentration.

Generally, in double-crucible apparatuses, the inner crucible is floated in outer molten raw material. Therefore, the quantity of inner molten is constant independent of the quantity of outer molten raw material. Thus, it is possible to draw up a single crystal having constant impurity concentration if the impurity concentration in the inner and an outer molten raw material are set to be c/k and c, respectively, where k represents a coefficient of segregation of impurity relative to molten impurity components and c represents the desired impurity concentration in the single crystal. In practice, the concentration of impurity in the inner and outer molten raw materials cannot always be set to be c/k and c, respectively, and the coefficient of impurity segregation k is not always equal to a balanced one. Therefore, in practice, it may be impossible to draw up a single crystal having an absolutely constant impurity concentration.

In order to eliminate the foregoing disadvantage, a specific double-crucible apparatus comprising an outer crucible and an inner crucible attached thereto has been proposed. Such a specific double-crucible apparatus as described above is disclosed, for example in U.S. Pat. No. 4,456,499 the substance of which is incorporated herein by reference, as if fully set forth. FIG. 5 is a cross section showing the double-crucible apparatus disclosed in that patent. FIG. 6 shows the impurity concentration when Sb is doped into a single crystal of Si. In the drawing, open and closed circles represent the results obtained using a single-crucible apparatus and the specific double-crucible apparatus, respectively.

In FIG. 5, inner crucible 51, comprising a cylindrical side wall 58 and an expanded annular portion 54, is formed in outer crucible 50. There is communication between the inside of inner crucible 51 and outer crucible 50 through thin through holes 52. Outer crucible 50 is a space defined by outer peripheral wall 53, cylindrical side wall 58, and expanded annular portion 54. The surface level of liquid in outer molten material 57 is always coincident with that of inner molten raw material 56. When single crystal 61 is drawn up out of inner molten raw material 56, inner molten raw material 56 decreases, however, it is compensated to a certain extent because outer molten material 57 flows into inner crucible 51 through thin through holes 52. Inner crucible 51 is not floated in outer molten material 57 and, therefore, the quantity of inner molten material 56 is not constant.

It is possible to draw up a single crystal having constant impurity concentration if respective impurity concentrations $c_a$ and $c_b$ in inner and outer crucibles 51 and 50, respectively, are expressed by the following equations (1) and (2):

$$c_a = \frac{c}{k} \tag{1}$$

$$c_b = \frac{c}{B}\left(A + B - \frac{A}{k}\right) \tag{2}$$

where, A and B represent cross sections of inner and outer crucibles 51 and 50, respectively.

As can be seen in FIG. 6, the increase in concentration of impurity is suppressed using this specific double-crucible method. Further, it is described in the prior art reference that the yield of single crystals is improved by 25-30%.

When the liquid encapsulation process is applied to the double-crucible method, however, the problems described hereunder, illustrated in FIGS. 7 to 9, are encountered.

FIG. 7 shows the step in which crystal seeding is carried out. The arrangement of outer crucible 1, inner crucible 2, and thin through holes 3 is the same as shown for the apparatus of FIG. 5. The surface level of an outer molten raw material 4 is coincident with that of an inner molten raw material 5. Further, the surface levels of outer and inner liquid capsules 6 and 7, respectively, are also coincident.

FIG. 8 shows the step in which a shoulder portion of single crystal 10 is formed. In this step, the thickness of liquid capsule 7 in inner crucible 2 increases because the diameter of single crystal 10 is much larger than that of seed crystal 8. When liquid capsule 7 becomes thicker in inner crucible 2, the surface level of inner molten raw material 5 in inner crucible 2 is lowered.

FIG. 9 shows the step in which a straight body portion of single crystal 10 is grown. The space between single crystal 10 and the surface of the wall of inner crucible 2 becomes smaller, and, therefore, the thickness of liquid capsule 7 becomes larger. As a result, the difference between inner surface 11 and outer surface 12 of inner and outer molten raw materials, respectively, increases further.

The temperature of the molten raw materials is higher than the melting point of the same, while the temperature of single crystal 10 is lower than the melting point thereof. The temperature at inner surface 11 is, of course, equal to the melting point of single crystal 10. However, the temperature at peripheral edge Q of the inner surface 11 is higher than the melting point because the temperature is influenced by the temperature of outer molten raw material 4. Further, the temperature at inner end point P on a top surface of outer molten raw material 4 is higher than the melting point of single crystal 10. Thus, a steep temperature gradient in the radial direction has to exist between the outer peripheral surface of single crystal 10 in inner crucible 2 and the inner peripheral wall of inner crucible 2.

Generally, in the method of drawing-up a single crystal, a vertical temperature gradient can be formed and easily controlled. However, it is difficult to control a temperature gradient in the radial direction. It is difficult to attain even formation of a temperature gradient in the radial direction in the vicinity of center portion of the crucible, and it is also difficult to keep the temperature gradient in the radial direction constant.

In the state shown in FIG. 9, there is a risk of remelting single crystal 10 from the side periphery thereof due to heat given thereto. Therefore, while short single crystals can be formed, it is impossible to produce elongated single crystals. In addition, single crystals may also be uneven in diameter and may have defects. In the extreme case, no single crystal may be grown as a result of a unstable temperature gradient in the radial direction.

Thus, in the method of drawing-up a single crystal, it is generally not desirable to form a temperature gradient in the radial direction. To this end, a difference in the surface level between inner and outer molten raw materials must not be allowed to exist.

SUMMARY OF THE INVENTION

An object of the present invention is to eliminate the disadvantages in the prior art.

Another object of the present invention is to provide a method of growing a single crystal and an apparatus therefor, in which a single crystal containing impurities is grown through a liquid capsule process using a double-crucible apparatus comprising an outer crucible and an inner crucible attached to the former, while maintaining the surface level of molten raw material in the outer and inner crucibles even with each other.

The present invention will be apparent from the following detailed description taken in conjunction with the accompanying drawings.

BRIEF DESCRIPTION OF THE DRAWINGS

FIG. 5 is a longitudinal cross section showing the arrangement of the fixed type double-crucible apparatus disclosed in the foregoing U.S. Pat. No. 4,456,499;

FIG. 6 is a graph showing variations in impurity concentration in single crystals drawn up by the double-crucible method disclosed in the U.S. Pat. No. 4,456,499 and by the conventional single-crucible method;

DETAILED DESCRIPTION OF THE PREFERRED EMBODIMENT

Figure 1:
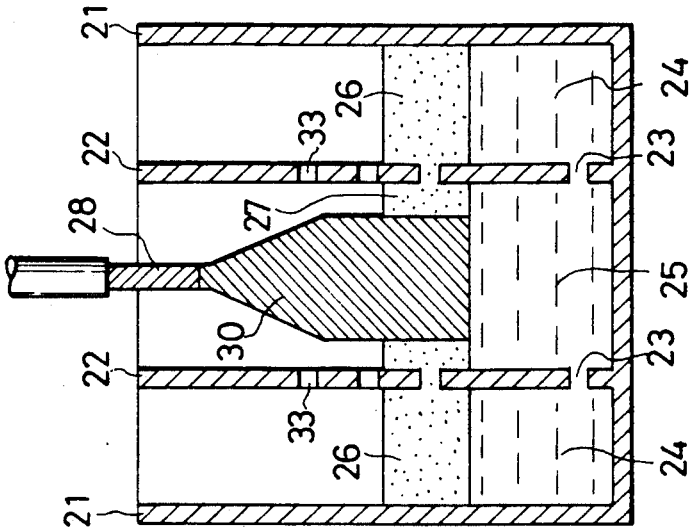
FIG. 1 is a longitudinal cross section showing the portion of the double-crucible apparatus used for execution of the double-crucible method according to the present invention.

FIG. 1 is a longitudinal cross section showing the portion of a double-crucible apparatus used for the double-crucible method according to the present invention.

The double-crucible apparatus comprises outer crucible 21 having a bottom portion, and inner crucible 22, part of the bottom portion of outer crucible 21 being used by inner crucible 22 as its bottom portion. Outer crucible 21 and inner crucible 22 are supplied with molten raw materials 24 and 25, respectively. Since the liquid capsule process is employed, the liquid surfaces of the molten raw materials 24 and 25 are covered with liquid sealing agents 26 and 27, respectively.

For the sake of simplification, the molten raw material and sealing agent in inner crucible 22 are referred to as inner molten raw material 25 and inner sealing agent 27, respectively. The molten raw material and sealing agent between the outer wall of inner crucible 22 and outer crucible 21 are referred to as outer molten raw material 24 and outer sealing agent 26, respectively.

Lower portions of side walls of inner crucible 22 are bored to form molten raw material through holes 23 which through holes allow for the communication between outer and inner molten raw materials 24 and 25, respectively.

The arrangement of the double-crucible apparatus according to the present invention is the same as that of the foregoing conventional apparatus. In the double-crucible apparatus according to the present invention, however, sealing agent through holes 33 are formed in the side walls of the inner crucible 22 at its upper portions, allowing communication between outer and inner sealing agent 26 and 27, respectively. Although sealing agent through holes 33 are disposed in three stages in this embodiment, sealing agent through holes 33 may be arranged in one or two stages depending on the thickness of the sealing agent. Sealing agent through holes 33 must be arranged in at least one stage to allow communication between outer and inner sealing agent 26 and 27, respectively.

The liquid surface of the sealing agent lowers since the liquid surface of the molten raw material lowers during the crystal growth. When there is at least one sealing agent through hole always contacting the sealing agent, the interface between the sealing agent and the molten raw material is even in inner and outer crucible.

The process of growing a single crystal includes a step of increasing the diameter of the single crystal so as to form a shoulder portion thereof, and a succeeding step of growing a straight body portion of the single crystal which straight body portion has a constant diameter. In the step of growing the straight body portion, the thickness of inner sealing agent 27 varies little, and, therefore, it is not necessary for inner sealing agent 27 and outer sealing agent 26 to communicate with each other. In this case, sealing agent through holes 33 may be formed only in the relatively upper portions of inner crucible 22.

As described above, in the present invention sealing agent through holes 33 are provided in the upper portions of the side wall of inner crucible 22 allowing communication between outer sealing agent 26 and inner sealing agent 27 at least during the formation of the shoulder portion of the single crystal. Sealing agent through holes 33 are necessary only in the upper portions of inner crucible 22 during this step. When there is initially no contact between sealing agent through holes 33 and molten raw material, the diameter of each of sealing agent through holes 33 may be selected as desired. When sealing agent through holes 33 are in contact with molten raw material in the first step, however, the diameter of the respective must be set to such a value as to prevent free communication between outer and inner molten raw material 24 and 25, respectively. Free communication is prevented because otherwise it is impossible to maintain a difference in concentration of impurity between outer and inner molten raw material 24 and 25, respectively. To this end, it is preferable to select a diameter not larger than 1 mm.

The surface tension of the molten raw material is generally larger than that of the liquid sealing agent. As the molten raw material passes through a thin hole less readily than does sealing agent, the diameter of each of molten raw material through holes 23 is often selected to be not smaller than 1 mm.

FIG. 1 shows the state where single crystal 30 is being drawn up following seed crystal 28. Seed crystal 28 is attached to the lower end of upper shaft 29.

Figure 2:
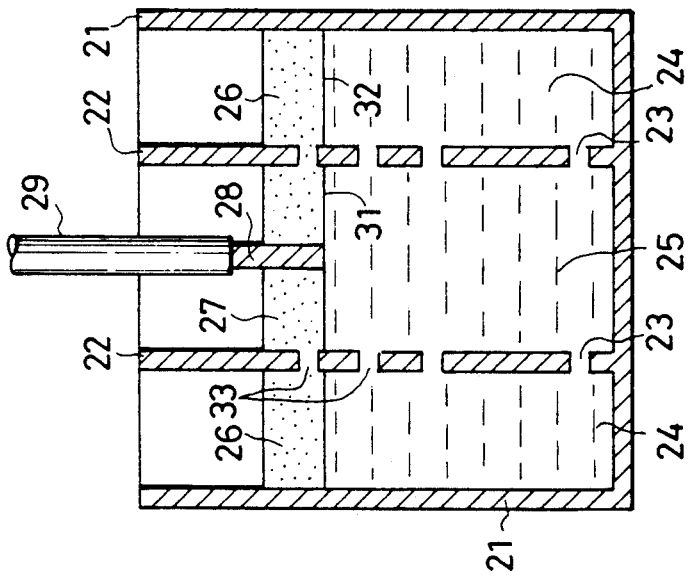
FIG. 2 is a longitudinal cross section showing the double-crucible apparatus according to the present invention in the state in which seeding is being carried out.
Figure 3:
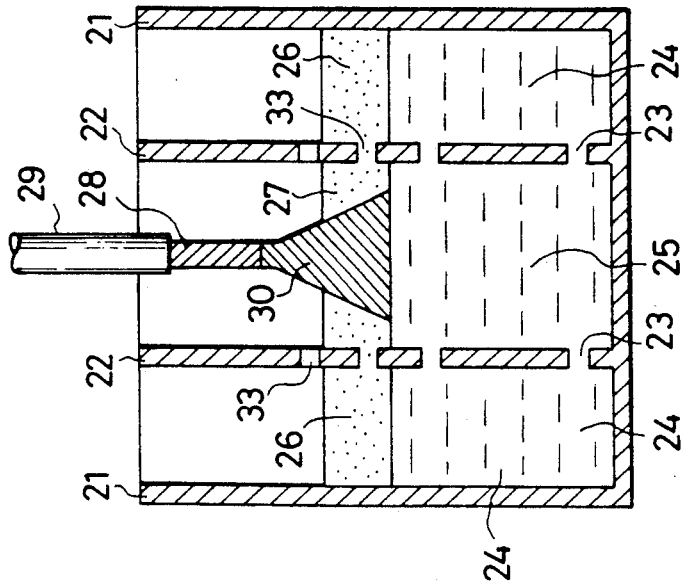
FIG. 3 is a longitudinal cross section showing the double-crucible apparatus according to the present invention in the state of termination of a period of growth of a straight body portion of a single crystal.

Referring to FIGS. 2 and 3, the operation of the double-crucible apparatus according to the present invention will be described hereunder.

FIG. 2 is a longitudinal cross section showing the step in which seeding of a single crystal is being carried out. As shown in the drawing, in this step, inner and outer molten raw materials 25 and 24, respectively, are even in surface level with each other. Inner and outer sealing agents 27 and 26, respectively, are also even in surface level. In this step, upper shaft 29 is moved down while being rotated so that seed crystal 28 is soaked into inner molten raw material 25 so as to grow single crystal 30. As a result, single crystal 30 following seed crystal 28 is gradually grown. Upper shaft 29 is then moved up while being rotated. First, the diameter of single crystal 30 is gradually increased so as to form the shoulder portion. In the step of forming the shoulder portion, the cross section of the single crystal 30 increases, so that the liquid surface level of inner sealing agent 27 increases. Inner sealing agent 27, however, flows into outer crucible 21 through sealing agent through holes 33, so that outer and inner sealing agents 26 and 27, respectively, are kept even in surface level.

FIG. 1 shows the state where the formation of the shoulder portion of single crystal 30 has been completed. In this state, outer and inner sealing agents 26 and 27, respectively, are even in surface level with each other, and outer and inner molten raw materials 24 and 25, respectively, are also even in surface level.

In the next step of the process, the straight body portion of single crystal 30 is grown. After the shoulder portion has come out of inner sealing agent 27, the volume of the single crystal 30 in inner molten raw material 25 varies little, and, therefore, the thickness of each of inner and outer sealing agents 27 and 26, respectfully, also varies little. Although the surface level of inner sealing agent 27 drops, no difference in surface level appears either between outer and inner sealing agents 27 and 26, respectively, or between inner and outer molten raw materials 25 and 14, respectfully, even if the sealing agents drop below sealing agent through holes 33.

FIG. 3 shows the state after the growth of the straight body portion of single crystal 30 has been completed. In this state, outer and inner molten raw material 24 and 25, respectfully, are even in surface level and outer and sealing agents 26 and 27, respectfully, are also even in surface level. Because of existence of sealing agent through holes 33 in the third stage which are in contact with outer and inner sealing agents 26 and 27, respectively, the perfect evenness in surface level is maintained. It is sufficient for sealing agent through holes 33 to be provided such that the sealing agents can be in contact with sealing agent through holes 33 at least in the lowermost stage until the growth of the shoulder portion has been completed.

EXAMPLE

A single crystal of GaAs containing Si as impurities was drawn up on the basis of the LEC process using $B_2O_3$ as a liquid sealing agent. An outer crucible of quartz having an inner diameter of 150 mm and an inner crucible of quartz having an inner diameter of 80 mm were used.

A polycrystal of GaAs was used as a raw material. The quantities of charge into the inner and outer crucibles were as follows:

TABLE 1

|  | Inner Crucible | Outer Crucible |
|---|---|---|
| GaAs Polycrystal | 887 g | 3113 g |
| $B_2O_3$ | 133 g | 467 g |
| Si | 0.25 g | 0 |

Two diametrically opposed sealing agent through holes 33 having a diameter of 3 mm were formed in inner crucible 22 at positions which are 2 mm higher than the interface between a molten raw material of GaAs and a molten sealing agent of $B_2O_3$ when the charged materials GaAs and $B_2O_3$ were molten. Two diametrically opposed molten raw material through holes 23 having a diameter of 1.5 mm were formed in inner crucible 22 at portions which are higher by about 5 mm than a bottom portion thereof.

A vessel accommodating the double-crucible apparatus therein was filled with a nitrogen gas to 10 atms and a heater was energized to thereby increase the temperature of the crucibles. First, the sealing agent of $B_2O_3$ was molten, and then the polycrystal of GaAs was molten. The molten raw material of GaAs was covered with the molten sealing agent of $B_2O_3$, the density of the latter being smaller than that of the former.

Group V elements were prevented from separating from the molten raw material by the application of high pressure nitrogen gas. The thickness of the molten $B_2O_3$ was about 20 mm.

Upper shaft 29 was moved down to thereby soak the seed crystal 28 into the molten raw material so as to grow single crystal 30. Upper shaft 29 was then moved up while being rotated. In the step in which the diameter of single crystal 30 was increased to form the shoulder portion, the thickness of $B_2O_3$ increased in inner crucible 22. The molten sealing agent of $B_2O_3$, however, flowed into outer crucible 21 through sealing agent through holes 33. The flowing-out of molten sealing agent of $B_2O_3$ continued until the respective liquid pressures of $B_2O_3$ on opposite sides of sealing agent through hole 33 were equal.

The equivalent pressure of $B_2O_3$ on opposite sides of the sealing agent through holes means that the height of the surface of the molten sealing agent of $B_2O_3$ on opposite sides of the sealing agent through holes are also equivalent. Since the respective molten sealing agents of $B_2O_3$ in outer and inner crucibles 21 and 22, respectively, are even in surface level, the respective molten raw materials covered with the molten sealing agents of $B_2O_3$ are also even in surface level. The concentration of Si in inner crucible 22 will be prevented from increasing as single crystal 30 is grown because the molten raw material containing no Si in outer crucible 21 flows into inner crucible 22.

In order to confirm the effects of the present invention, a single crystal of Si-doped GaAs was grown using the conventional single-crucible apparatus and the thus obtained single crystal was compared with the single crystal obtained according to the present invention. In both the processes according to the present invention and the process according to the conventional technique, the Si concentration in the vicinity of the seed crystal was controlled to be $4 \times 10^{18}$ atom/cm$^3$.

Figure 4:
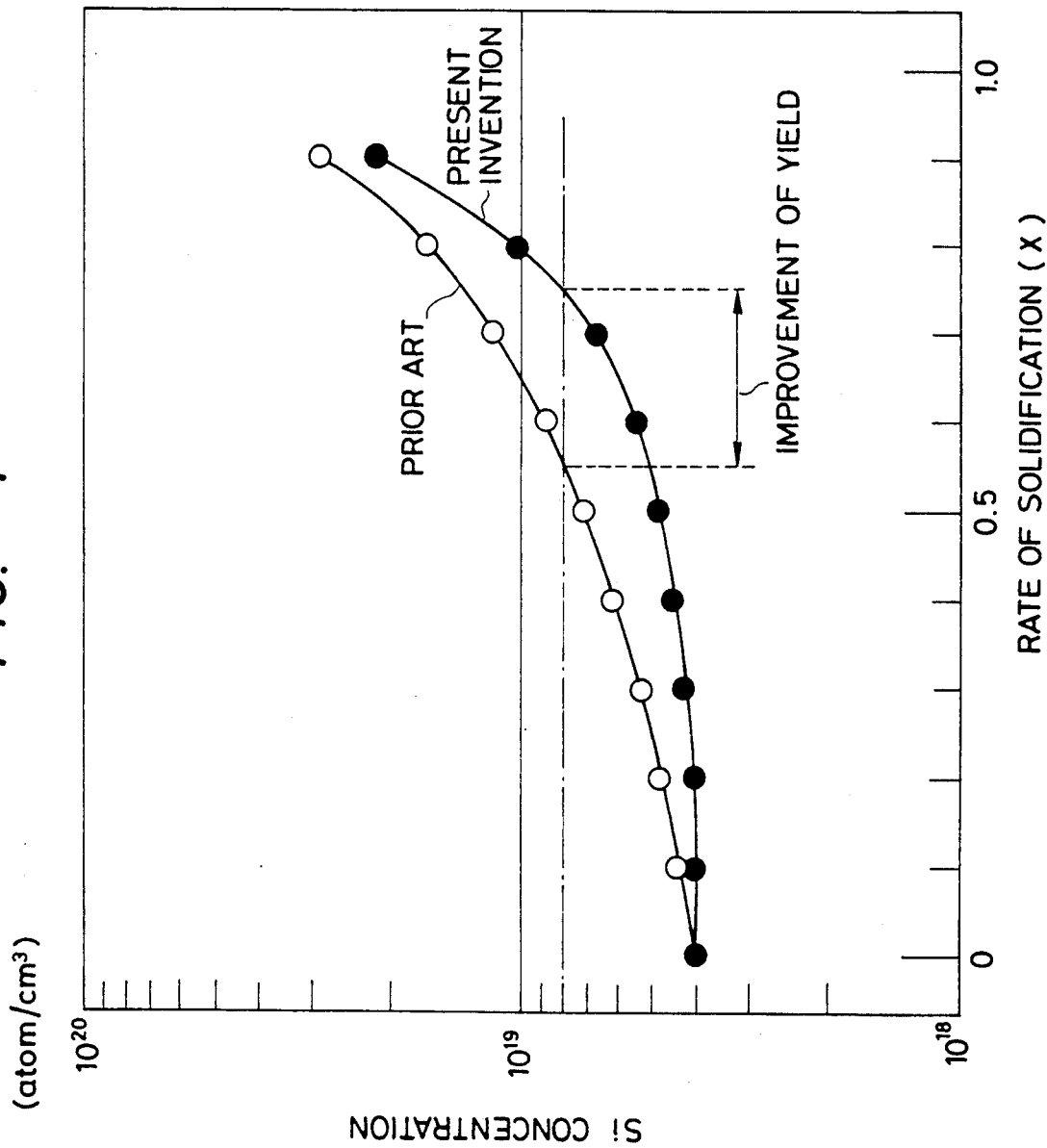
FIG. 4 is a graph showing variations in Si concentration relative to the rate of solidification when single crystals of Si-doped GaAs have been grown by the double-crucible method according to the present invention and the conventional single-crucible method.
Figure 7:
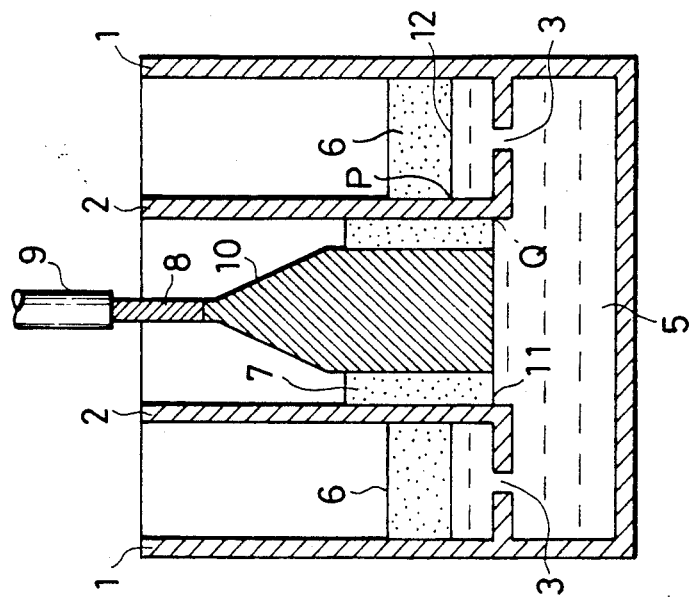
FIG. 7 is a longitudinal cross section showing the conventional fixed type double-crucible apparatus used in the liquid capsule process in the state in which seeding is being carried out.
Figure 8:
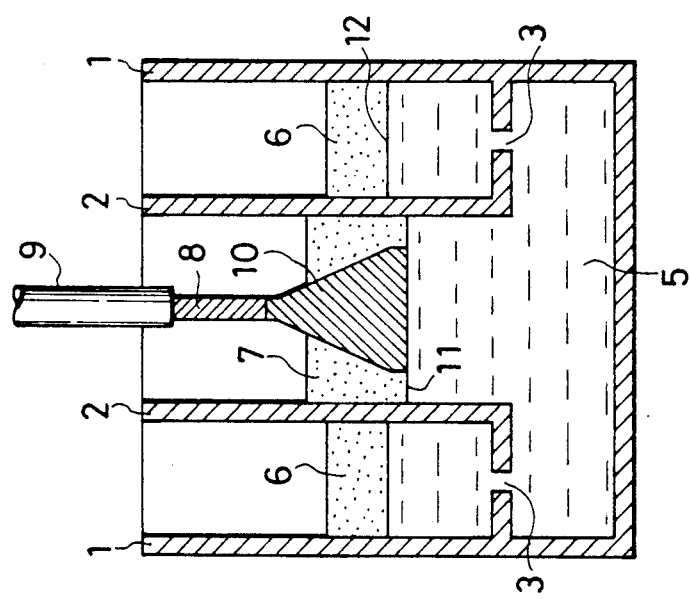
FIG. 8 is a longitudinal cross section showing the same fixed type double-crucible apparatus used in the liquid capsule process in the state in which a shoulder portion of the single crystal is being formed.
Figure 9:
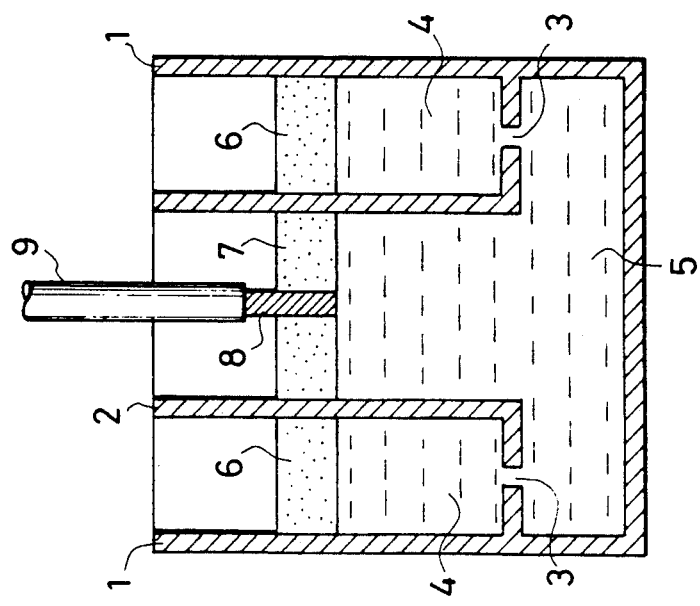
FIG. 9 is a longitudinal cross section showing the same fixed type double-crucible apparatus applied to the liquid capsule process in the state in which a straight portion of the single crystal is being grown.

FIG. 4 is graph showing the Si concentration at portions from the seed end (a front portion) of the crystal to the end (a back portion) opposite to the seed end of the same. In the drawing, the abscissa represents the rate of solidification, which is a value obtained by dividing the weight from the front end to a point of the crystal by the quantity of initially charged raw material. The rate of solidification is a parameter which closely corresponds to the distance from the seed end to the measuring point. The ordinate represents the Si concentration (atom/cm$^3$) in the crystal. Closed and open circles represent the results obtained using the present invention and using the conventional single-crucible apparatus, respectively. As can be seen in FIG. 4, the yield of single crystals having the Si concentration within a range of $4-8 \times 10^{18}$ atom/cm$^3$ using the present invention was 75%. Using the conventional single-crucible apparatus, the yield of the single crystals was 55%. Thus, the yield was improved by about 36% using the present invention.

Next, the rate of single-crystallization obtained by using the double-crucible apparatus provided with sealing agent through holes according to the present invention was compared with that obtained using the conventional double-crucible apparatus provided with no sealing agent through holes. Using the conventional double-crucible apparatus, the rate of single-crystallization was 32%. Using the present invention, the rate of single-crystallization was 63%. This rate of single-crystallization is the weight of a crystallized portion compared to the weight of the initially charged raw material. In view of the rate of single-crystallization, the double-crucible apparatus according to the present invention is exceedingly superior to the conventional one.

In the conventional double-crucible apparatus having no sealing agent through holes, there occur differences in the surface level of the molten raw material as well as the sealing agent in the outer and inner crucibles. Accordingly, it becomes necessary to maintain the temperature gradient in the radial direction. It is difficult, however, to maintain such a temperature gradient as described above using a vertically arranged heater. Therefore, the growth of the single crystal becomes unstable and twin crystals and polycrystals are apt to be generated.

Thus, the following effects can be obtained according to the present invention.

(1) It is possible to grow a single crystal having uniform impurity concentration because the double-crucible method is used.

(2) The double-crucible apparatus according to the present invention is different from the generally used double-crucible apparatus in which an inner crucible is floated in the molten raw material. According to the present invention, an inner crucible is attached to an outer one, and therefore, the inner crucible cannot move freely the radial direction. The inner crucible cannot come into contact with the single crystal. The state of the molten in the inner crucible is stable, so that few defects, such as dislocation or line defect, occur in the single crystal as compared with the generally used conventional double-crucible apparatus.

(3) The rate of single-crystallization according to the present invention is high because there occurs no difference in height of the interface between the respective moltens in the inner and outer crucibles in comparison with the conventional fixed type double-crucible apparatus having no sealing agent through holes.

What is claimed is:

1. A method of drawing up a single crystal using a double-crucible apparatus comprising the steps of:
   a) providing a double-crucible apparatus including an outer crucible and an inner crucible attached in said outer crucible, said inner crucible having first holes formed at its lower portions to allow molten raw material to move therethrough, and second holes formed at its upper portions to allow sealing agent to move therethrough;
   b) pouring molten raw materials of different impurity concentration into said outer and inner crucibles, and pouring liquid sealing agents into said outer and inner crucibles so that said molten raw materials in said outer and inner crucibles are covered with said liquid sealing agents and so that said liquid sealing agents in said outer and inner crucibles are in contact with said second holes;
   c) soaking a seed crystal in said molten raw material in said inner crucible in an atmosphere of an inert gas; and
   d) gradually drawing up said seed crystal so that a single crystal is grown, said sealing agents being controlled to be in contact with said second holes at least until the formation of a shoulder portion of said single crystal is completed.

2. A method of drawing up a single crystal from a double-crucible apparatus comprising the steps of:
   (a) pouring molten raw material into an inner crucible of a double-crucible apparatus, and pouring the same molten raw material into an outer crucible of said double-crucible apparatus;
   (b) covering said molten raw material in each of said inner and outer crucibles with a liquid sealing agent;
   (c) soaking a seed crystal in said molten raw material in said inner crucible in an atmosphere of inert gas;
   (d) mixing said raw materials in said outer and inner crucibles while gradually drawing up said seed crystal, said mixing being controlled so as to maintain a constant level of impurity concentration within said inner crucible raw material; and
   (e) simultaneously maintaining the level of said sealing agent within each of said inner and outer crucibles as said seed crystal is drawn up, at least until the formation of a shoulder portion of said single crystal is completed.

3. In a fixed double-crucible for the growth of semiconductor single crystals apparatus, the apparatus comprising:
   (a) an outer crucible;
   (b) an inner crucible attached to said outer crucible;
   (c) means formed on a lower portion of said inner crucible for allowing restricted passage of low impurity molten raw material from said outer crucible to a higher impurity raw material in said inner crucible;
   the improvement comprising:
   (d) means formed on an upper portion of said inner crucible for allowing unrestricted passage of an encapsulent liquid between said inner and outer crucibles.

4. The apparatus of claim 3, wherein said means formed on a lower portion of said inner crucible consists of a plurality of holes in said inner crucible, said holes each having a diameter of 1 mm or less, and wherein said means formed on an upper portion of said inner crucible consists of a plurality of holes each having a diameter of 1 mm or more.

* * * * *